United States Patent [19]
Kitagawa et al.

[11] Patent Number: 6,166,380
[45] Date of Patent: Dec. 26, 2000

[54] RESOLVING POWER EVALUATION METHOD AND SPECIMEN FOR ELECTRON MICROSCOPE

[75] Inventors: Taiji Kitagawa, Fujisawa; Mitsugu Sato, Hitachinaka; Goroku Shimoma, Minori-machi; Tadanori Takahashi, Hitachinaka; Naoto Yoshida, Hitachinaka; Masayuki Yukii, Hitachinaka; Takanori Ninomiya, Hiratsuka; Tatsuo Horiuchi, Chigasaki; Keisuke Kawame, Yokohama, all of Japan

[73] Assignee: Hitachi, Ltd., Tokyo, Japan

[21] Appl. No.: 09/070,839

[22] Filed: May 1, 1998

[30] Foreign Application Priority Data

May 8, 1997 [JP] Japan .................................. 9-118494
Nov. 18, 1997 [JP] Japan .................................. 9-316811

[51] Int. Cl.[7] .............................. G01N 1/28; H01J 37/26
[52] U.S. Cl. ........................ 250/307; 250/310; 250/311
[58] Field of Search ................................... 250/305, 306, 250/307, 310, 311

[56] References Cited

U.S. PATENT DOCUMENTS 5,555,319  9/1996  Tsubusaki et al. ..................... 382/170
5,945,833  8/1999  Mil'shtein et al. ..................... 324/751

FOREIGN PATENT DOCUMENTS 545265  2/1993  Japan .

*Primary Examiner*—Bruce C. Anderson
*Assistant Examiner*—Nikita Wells
*Attorney, Agent, or Firm*—Antonelli, Terry, Stout & Kraus, LLP

[57] ABSTRACT

An electron microscope resolving power evaluation method for evaluating performance of a scanning electron microscope without resorting to visual sensory analysis for minimizing a difference in deterioration with age and in performance among individual scanning electron microscopes. A specimen is prepared by overlaying materials having different emission coefficients of secondary charged particles such as secondary electrons, backscattered electrons, transmitted electrons, etc., a cross-section including an overlaid material part of thin-film layers having known dimensions is mirror-finished, data of a scanning electron microscopical image of the cross-section, including the overlaid material part is obtained, and then the resolving power performance of the scanning electron microscope is evaluated quantitatively by means of frequency analysis, etc.

9 Claims, 12 Drawing Sheets

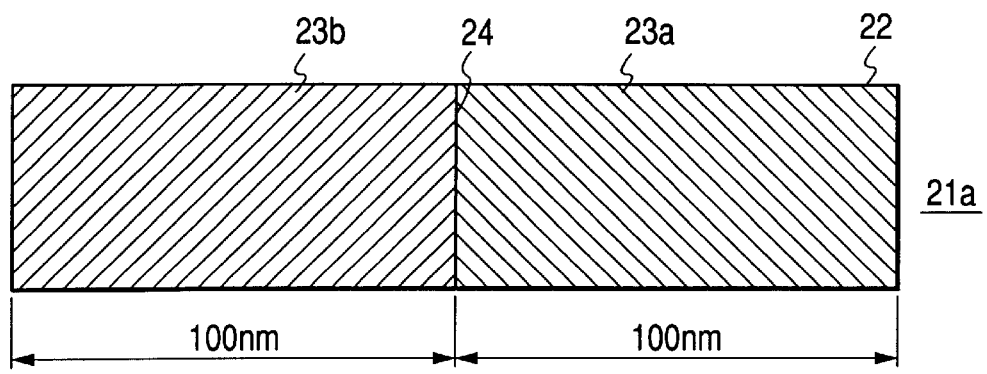
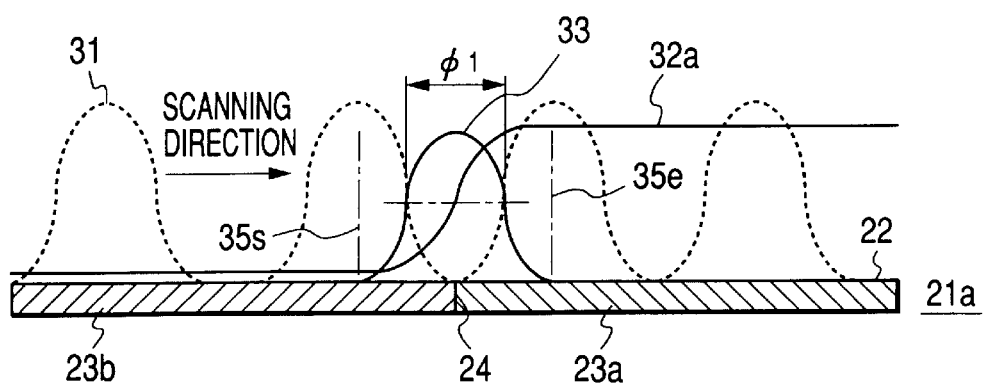

RESOLVING POWER EVALUATION METHOD AND SPECIMEN FOR ELECTRON MICROSCOPE

BACKGROUND OF THE INVENTION

The present invention relates to a specimen prepared for quantitative evaluation of the resolving power/resolution performance of an electron microscope, a method of evaluating and adjusting the electron microscope resolving power using the prepared specimen, an electron microscope capable of quantitative evaluation of the resolving power thereof, and a method of fabricating semiconductor devices using the electron microscope.

Conventionally, the resolving power of an electron microscope is evaluated using the distance between two points visible on a specimen. In Japanese Non-examined Patent Publication No. 45265/1993, there is disclosed an electron microscope resolving power evaluation method in which a gold-particle-evaporated carbon specimen is observed with an electron microscope and the resolving power thereof is determined based on a minimum distance between two gold particles. Also, electron microscope resolution is evaluated based on a degree of blurring on a particle boundary.

In the conventional resolving power evaluation method using gold-particle images observed with an electron microscope, variations in size and shape of the gold particles cause differences in the results of measurement among individual analysts and identical specimens are not reproducible, making it difficult in practice to obtain accurate quantitative evaluation of the resolving power. Furthermore, no method is available for accurately measuring a distance between gold particles under electron microscope observation, and there is an instrumental error in resolving power among individual electron microscopes. Therefore, in semiconductor device fabrication, where the dimensions of circuit patterns on a semiconductor device are measured using a plurality of electron microscopes, an observed image of each semiconductor device may differ among electron microscopes, resulting in a problem that a defect is observable or not observable depending on the electron microscope being employed. As a consequence, it is not possible to implement semiconductor device fabrication based on predetermined consistent control data values.

SUMMARY OF THE INVENTION

It is therefore an object of the present invention to overcome the above-mentioned disadvantages by providing a specimen for use in evaluation of the resolving power of an electron microscope, and a method of evaluating and adjusting the resolving power thereof.

In accomplishing this object of the present invention and according to one aspect thereof, there is provided a multi-thin-film-layered specimen which is advantageous in that an arbitrary thickness and a combination of film materials are permitted, instead of a gold-particle-evaporated carbon specimen of the type employed in the conventional resolving power evaluation method, and there is provided a numeric processor incorporated in an electron microscope for carrying out evaluation of the resolving power. For use in such evaluation, each multi-thin-film-layered specimen is analyzed in a depth direction thereof by means of X rays or the like, and a cleft along a cross-section thereof having accurate known dimensions is observed.

Each multi-thin-film-layered specimen is prepared using a combination of materials which are significantly different in atomic number, e.g., a combination of tantalum and silicon, so that step signals or square wave signals having different frequencies can be attained during specimen surface image scanning using the electron microscope. In this case, an electron beam profile is provided through differentiation of data corresponding to the step signals attained during specimen surface image scanning using the electron microscope, and the diameter and shape of the electron beam can be evaluated quantitatively by setting a threshold, such as a half-value width. Furthermore, quantitative evaluation of the resolution can be made through calculation of contrast or other data corresponding to the square wave signals. In addition, by applying an optical resolution limit determination method, electron microscope resolution can be calculated using Rayleigh criterion of resolution on a two-slit-pattern image.

On a plurality of electron microscopes where such a specimen as mentioned above is mounted, it is possible to provide identical resolving power/resolution by adjusting the focusing voltage or other instrumental parameters of each electron microscope. This enables image observation under identical conditions among different models of electron microscopes.

More specifically, according to the present invention, there is provided a method of effecting quantitative evaluation of electron microscope resolving power in which a specimen is prepared by overlaying materials having different emission coefficients of secondary charged particles, such as secondary electrons, backscattered electrons, transmitted electrons, etc.; a cross-section including an overlaid material part of the specimen, is irradiated with an electron beam to attain a secondary charged particle image of the cross-section of the specimen by detecting secondary charged particles emitted therefrom; and quantitative evaluation of the electron microscope resolving power is performed using the secondary charged particle image thus attained.

In the specimen preparation, a thin film of material is formed on a substrate, which material is different from that of the substrate in the emission coefficient of such secondary charged particles as secondary electrons, backscattered electrons and transmitted electrons.

Still more, in the specimen preparation, thin films of plural materials, having different emission coefficients of such secondary charged particles as secondary electrons, backscattered electrons and transmitted electrons, are laminated on a substrate.

Further, according to the present invention, there is provided an electron microscope resolving power evaluation specimen which comprises a resolving power evaluation cross-section including an overlaid part of two or more materials having different emission coefficients of such secondary charged particles as secondary electrons, backscattered electrons and transmitted electrons.

Furthermore, according to the present invention, there is provided an electron microscope resolving power evaluation specimen which is formed of thin films of two or more materials having different emission coefficients of such secondary charged particles as secondary electrons, backscattered electrons and transmitted electrons.

Moreover, according to the present invention, there is provided an electron microscope resolving power evaluation specimen which includes laminated thin films of plural materials having different emission coefficients of such secondary charged particles as secondary electrons, backscattered electrons and transmitted electrons.

Besides, according the present invention, there is provided an electron microscope adjustment method in which a specimen is prepared by laminating materials having different emission coefficients of such secondary charged particles as secondary electrons, backscattered electrons and transmitted electrons, a cross-section including a laminated part of the specimen is irradiated with an electron beam in an electron microscope to attain a secondary charged particle image of the cross-section of the specimen by detecting secondary charged particles emitted therefrom, evaluation of resolving power of the electron microscope is performed using the secondary charged particle image thus attained, and an electron optical system, vacuum system or electron gun of the electron microscope is adjusted according to the result of evaluation of the resolving power thereof.

The above and other objects, features and advantages of the present invention will become more apparent from the following description of various embodiments with reference to the accompanying drawings.

BRIEF DESCRIPTION OF THE DRAWINGS

FIG. 2 is a diagram which shows an example of a performance evaluation specimen comprising two layers;

FIG. 3 is a diagrammatic illustration of a performance evaluation method using the specimen shown in FIG. 2;

DETAILED DESCRIPTION OF THE PREFERRED EMBODIMENTS

The present invention will now be described in detail by way of example with reference to the accompanying drawings.

Figure 1:
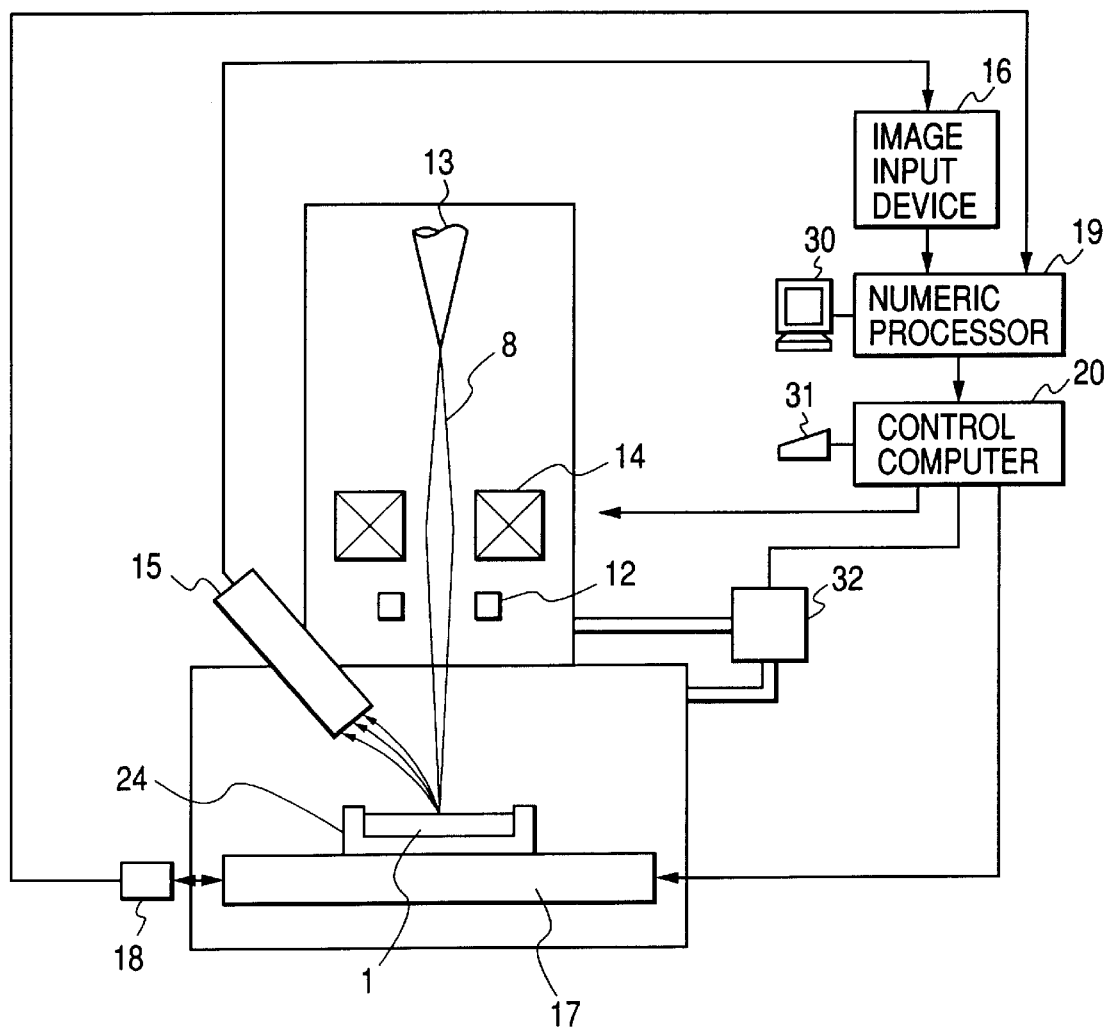
FIG. 1 is a schematic structural diagram of a scanning electron microscope.

FIG. 1 is a schematic structural diagram of a preferred embodiment of a scanning electron microscope (SEM) in which evaluation and adjustment of the resolving power can be performed according to the present invention. An electron optical system of the SEM comprises an electron gun 13, a deflector 12, an electromagnetic lens 14, etc. An electron beam 8 emitted from the electron gun 13 at a desired accelerating voltage is converged through the electromagnetic lens 14, and the electron beam thus converged is scanned over a surface of a specimen 1, mounted on an X-Y-Z stage 17, in an arbitrary sequence by means of the deflector 12, etc. Further, secondary electrons or backscattered electrons emitted from the surface of the specimen 1 irradiated with the electron beam are detected by a detector 15, and image data attained through such detection is fed to an image input device 16. The specimen 1 under observation can be moved in any three-dimensional direction on the X-Y-Z stage 17. With synchronization of movement of the X-Y-Z stage, electron beam irradiation and image data input are performed, and stage movement is controlled under direction of a control computer 20. While the preferred embodiment of the SEM shown in FIG. 1 uses a secondary electron image for specimen observation, it is also possible to use an image attained with backscattered electrons, transmitted electrons, etc. Detection of transmitted electrons is implemented by means of a technique known as STEM.

The following describes a specimen 21 for SEM resolving power evaluation. In preparation of the specimen 21, thin films of materials which are significantly different in atomic number, e.g., Ta film and Si film, W film and C film, Ru film and C film, Mo film and B4C film, W film and Si film, etc. are laminated alternately to form multiple layers on a single-crystal silicon substrate through film-thickness-controlled processing by means of a well-known thin film forming technique, such as plating, CVD (chemical vapor deposition), PVD (physical vapor deposition), etc., and the substrate having multi-layered thin films is cleft to provide a surface having a cross-section 22 for observation. In imaging the cross-section 22, a difference in secondary electron emission coefficient between film materials makes it possible to form an appreciably contrasted image, e.g., Ta, W, Ru and Mo films having a high emission coefficient of secondary electrons appear to be white, and Si, C, and B4C films having a low emission coefficient of secondary electrons appear to be black.

For attaining a cross-section of multi-layered thin films of these materials, a technique using a cleavage plane is known (a crystal mineral material is liable to fracture in a certain orientation to make a smooth cleavage plane appear). If the degree of surface roughness of the cross-section 22 is relatively large with respect to a level of resolving power to be evaluated, the following treatment is made, for example; polishing particles of less than 100 nm in diameter are buried in a tin surface plate, and the cross-section 22 is polished on the tin surface plate so that the degree of surface roughness of the cross-section 22 will be on the order of less than a few nm.

In examination of the SEM resolving power, a specimen 21a shown in FIG. 2 is used for example. A convergent spot of the electron beam 8 emitted from the electron gun 13 at a desired accelerating voltage is scanned over a surface of a cross-section 22 containing a layer of Ta 23a and a layer of Si 23b, each layer having a thickness that is sufficiently larger than the diameter of the convergent spot of the electron beam 8, e.g., approx. 100 nm. In this scanning operation, an electron beam energy distribution 31 and a secondary electron intensity 32a detected by the detector 15 for input to the image input device 16 are obtained, as shown in FIG. 3. Using a signal of the secondary electron intensity 32a supplied from the image input device 16, a numeric processor 19 acquires a differential signal 33 through differentiation, and according to the differential signal 33, it can identify a start-of-scan point 35s and an end-of-scan point 35e of the electron beam spot on a boundary 24 between the Ta layer 23a and Si layer 23b. Then, the numeric processor 19 calculates the difference between the two points 35s and 35e to determine a diameter of the electron beam spot. For determination of the electron beam diameter, the numeric processor 19 may also use a half-value width 1 of a curve 33 drawn through differentiation of variations in secondary electron output.

Since the value of the electron beam diameter is assumed to be equivalent to that of the resolving power, quantitative evaluation of SEM performance can be carried out in this way. Furthermore, by approximating the secondary electron intensity 32a through B-spline approximation or approximating the differential signal 33 through normal distribution function approximation, the signal noise component level can be reduced to enable measurement of an electron beam diameter with satisfactory reproducibility. In this case, it is not always necessary to laminate the Si layer 23 band the Ta layer 23a alternately on the Si substrate in a film deposition process, i.e., a plurality of any materials having significantly different emission coefficients of secondary electrons may be laminated by means of compression or adhesion.

Figure 4:
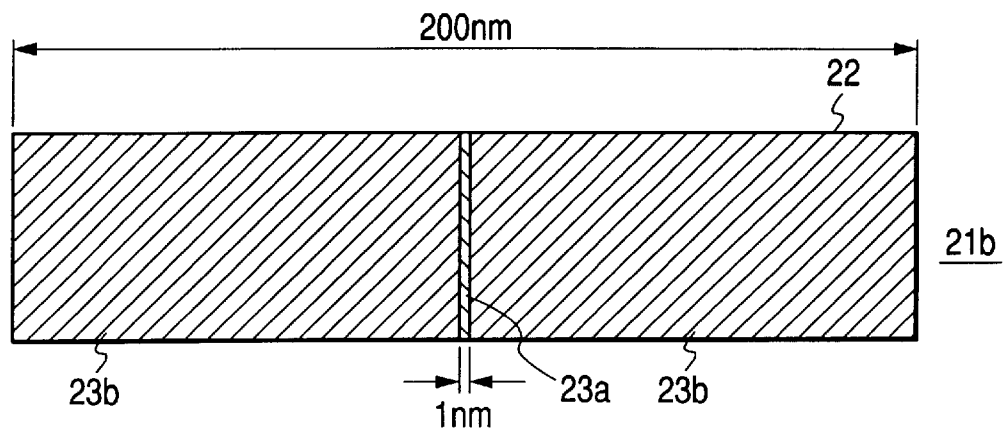
FIG. 4 is a diagram which shows an example of a performance evaluation specimen in which one thin film is sandwiched between two layers.
Figure 5:
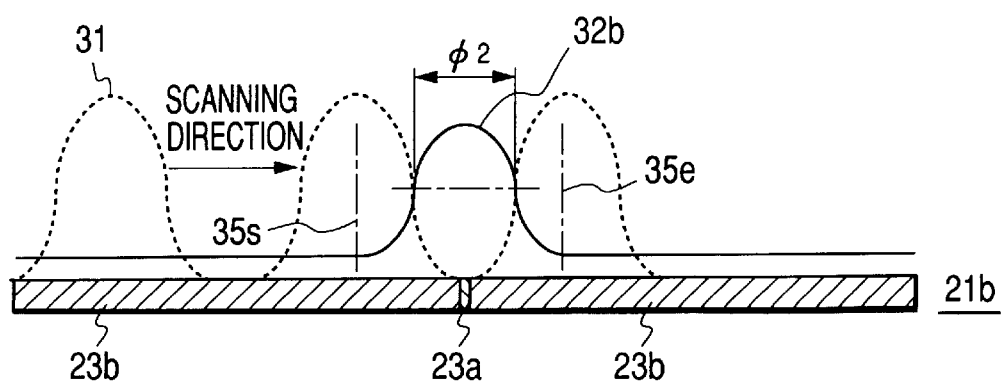
FIG. 5 is a diagrammatic illustration of a performance evaluation method using the specimen shown in FIG. 4.

The following describes a method of SEM resolving power measurement using the specimen 21b shown in FIG. 4. In preparation of the specimen 21b, for example, a thin layer of Ta 23a having a thickness of approx. 1 nm is sandwiched between Si layers 23b, each having a thickness that is sufficiently larger than the diameter of the electron beam, and a cross-section of these layers is used for observation. When a convergent spot of the electron beam emitted from the electron gun 13 at a desired accelerating voltage is scanned over a surface of a cross-section 22 of the specimen 21b, an electron beam energy distribution 31 and a secondary electron intensity 32b detected by the detector 15 for input to the image input device 16 are obtained, as shown in FIG. 5. By subtracting a value of background (secondary electron intensity attained from the Si layer 23b) from a curve of the secondary electron output, the numeric processor 19 can identify a start-of-scan point 35s and an end-of-scan point 35e of the electron beam spot on the Ta layer. Then, the numeric processor 19 subtracts the film thickness of Ta from the difference between the two points 35s and 35e to determine the diameter of the electron beam spot. As in the case of using the specimen 21a shown in FIG. 2, for determination of the electron beam diameter, the numeric processor 19 may also calculate a half-value width φ2 and then subtract the film thickness of Ta from it. In this case, by providing different film thicknesses of the thin Ta layer, e.g., 0.5 nm, 2 nm, and 3 nm, the secondary electron emission intensity can be changed. Thus, the numeric processor 19 can determine the energy distribution of the electron beam with high accuracy.

Figure 6:
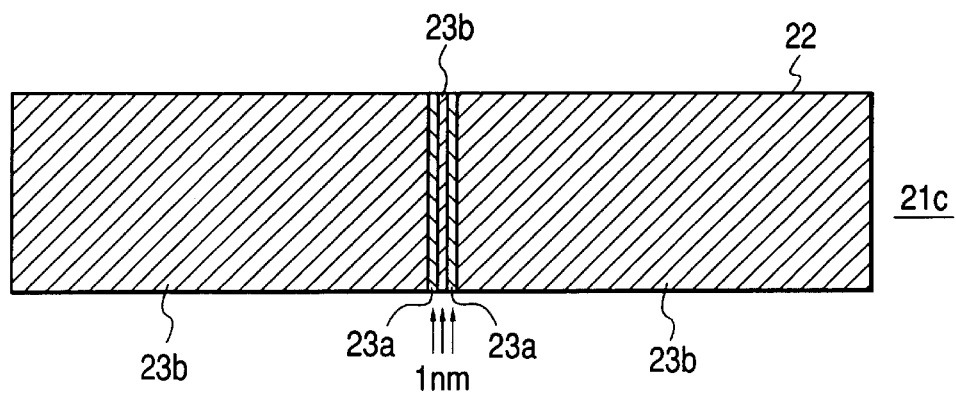
FIG. 6 shows an example of a performance evaluation specimen in which two thin films are sandwiched in three layers.

The following describes a method of SEM resolving power/resolution measurement using the specimen 21c shown in FIG. 6. In scanning the specimen 21c, which has a pattern containing thin white slits 23a on a black background 23b as indicated in FIG. 6, it is possible to attain a signal representative of emission intensity through diffraction pattern imaging similar to observation of two pinholes on a general optical system. In optics, the Rayleigh limit of resolution is defined as found in "Wave Optics" (Hadou Kogaku)—p. 359 to 377, published by Iwanami Shoten, and when a minimum value of a center part of such a signal is less than 74% of a maximum value, two pinhole images are assumed to be detectably separated.

Figure 7:
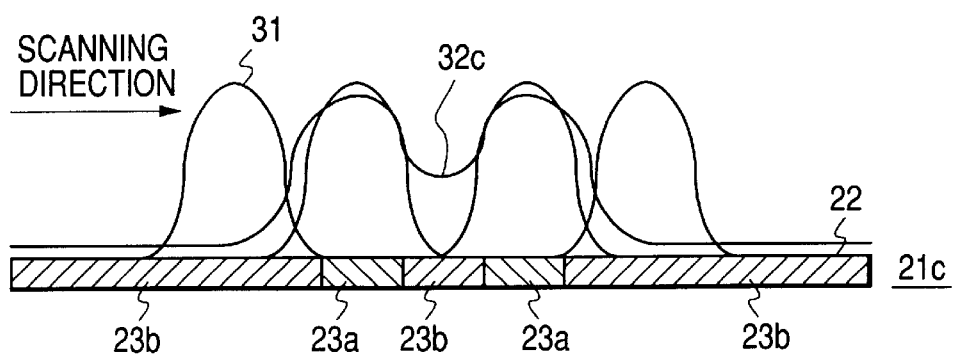
FIG. 7 is a diagrammatic illustration of a performance evaluation method using the specimen shown in FIG. 6.

For applying the definition of Rayleigh limit of resolution to SEM performance evaluation, the specimen 21c is prepared so as to have a pattern containing thin white slits 23a on a black background 23b (stripe pattern containing white slit layers of Ta on black background layers of Si, for example). In preparation of the specimen 21c, the interval of the slits corresponding to the thickness of each striped film is controlled to correspond to a desired value of resolving power, i.e., it is controlled to be 1 nm for SEM adjustment to provide a resolving power of 1 nm. As shown in FIG. 7, the numeric processor 19 subtracts a value of background (secondary electron intensity attained from a layer of Si 23b) from a maximum value and a minimum value of a center part of a secondary electron intensity variation signal 32c attained in SEM imaging of the specimen 21c. For instance, if a ratio of minimum to maximum values is 74%, the value of the resolving power or resolution limit can be defined as 1 nm.

Figure 12:
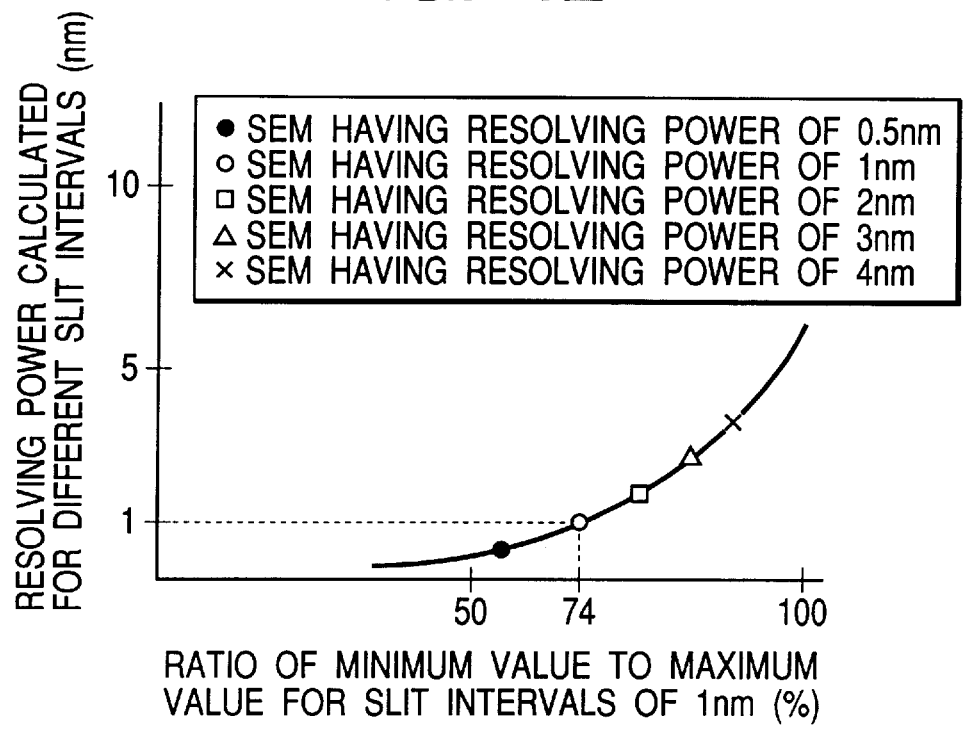
FIG. 12 is a SEM resolving power evaluation chart.
Figure 13:
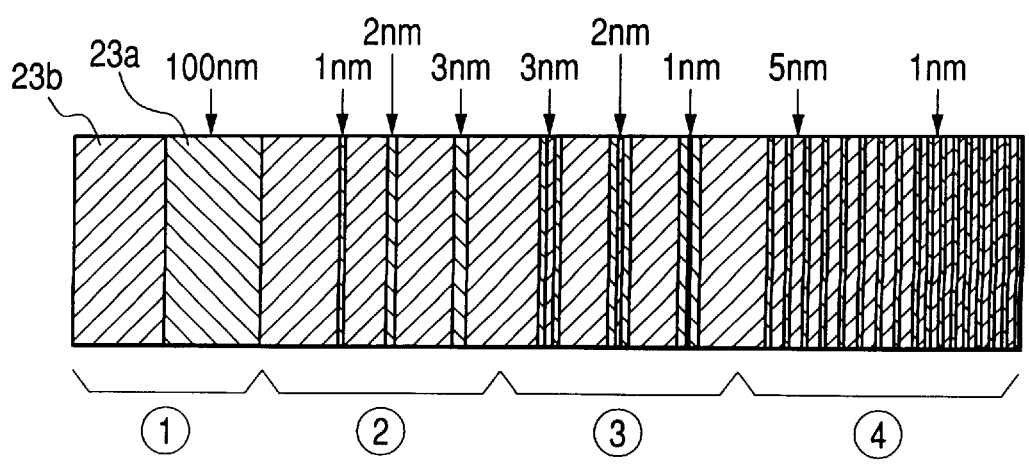
FIG. 13 is a diagram which shows an example of a performance evaluation specimen configuration.

Using a specimen having a configuration such as mentioned above, it is possible to change the level of the resolving power under evaluation by changing the interval between slits. Furthermore, for individual SEM instruments possessing different resolving powers or resolution limits, quantification can be made by means of a specimen as shown in FIG. 13, which is prepared to provide different sets of slit intervals in the manner mentioned above. Thus, the numeric processor 19 can carry out quantitative evaluation of the resolving power/resolution limit using data obtained from a certain specimen having predetermined slit intervals. More specifically, if a performance evaluation chart is prepared, as shown in FIG. 12, through relating quantitative resolving power/resolution limit data by means of function approximation, etc., the numeric processor 19 can quantitatively evaluate the resolving power/resolution limit using data of minimum and maximum values measured on the specimen having slit intervals of 1 nm, for example.

A method of Fourier-transform frequency analysis on an image of the specimen 21d shown in FIG. 8 for SEM resolution measurement will be described.

Figure 8:
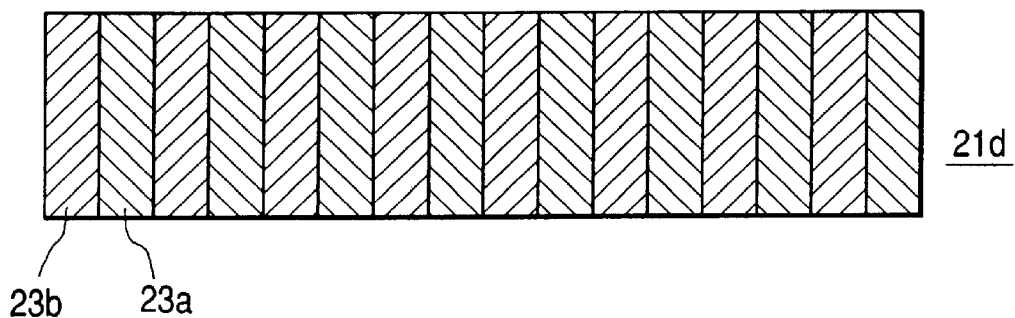
FIG. 8 is a diagram which shows an example of a performance evaluation specimen in which films are formed in a stripe pattern.
Figure 9:
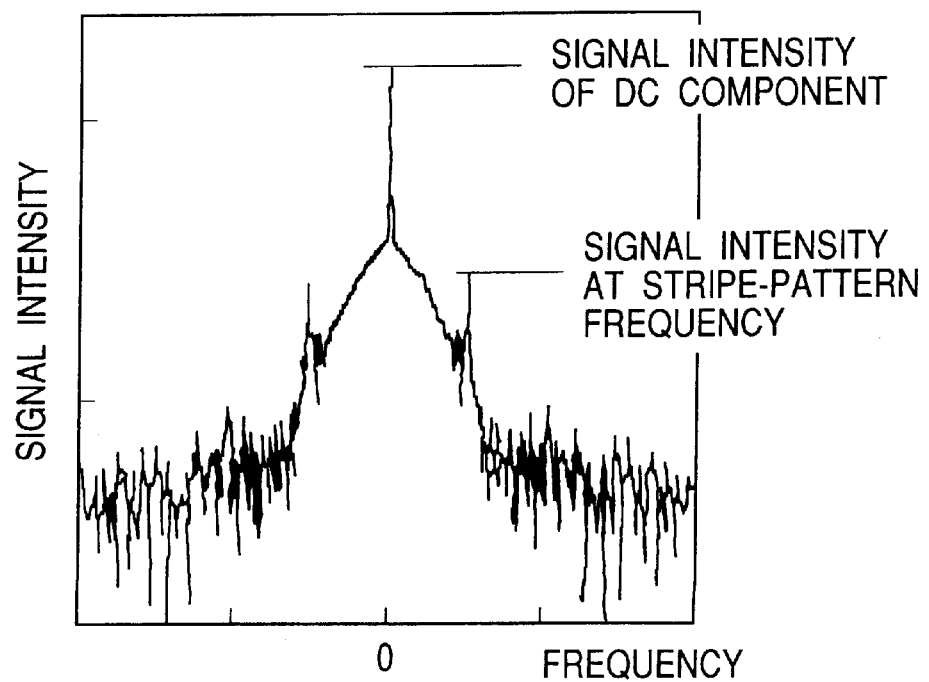
FIG. 9 is a diagrammatic illustration showing a performance evaluation method based on frequency analysis.

SEM image data of the specimen 21d comprising multiple thin films arranged to provide an equally spaced stripe pattern, as shown in FIG. 8, is supplied to the numeric processor 19, in which one-dimensional or two-dimensional Fourier transformation is then performed. FIG. 9 shows a graph indicating a relationship between stripe-pattern frequency and signal intensity with respect to a power spectrum obtained through Fourier transformation. Note that the origin where a DC component is maximized corresponds to zero in frequency.

In this graph, the frequency on the abscissa increases leftward and rightward from the origin at the center. Using a peak signal intensity at the stripe-pattern frequency, the numeric processor 19 can carry out quantitative evaluation of the resolution. Still more, the numeric processor 19 can quantitatively evaluate resolution using a ratio or difference between the signal intensity of a DC component and a stripe-pattern peak signal intensity. That is, resolution becomes better as the stripe-pattern peak signal intensity increases toward the signal intensity of the DC component.

Through imaging of the specimen 21d shown in FIG. 8 for SEM resolution measurement, it is also possible to determine the value of CTF (contrast transfer function). In this case, quantitative evaluation of resolution can be performed using the following expression: (maxL−minL)/(maxL+minL)×100 (%), where 'maxL' indicates a maximum luminance value of a stripe-pattern part of image data of the specimen, and 'minL' indicates a minimum luminance value thereof.

Figure 10:
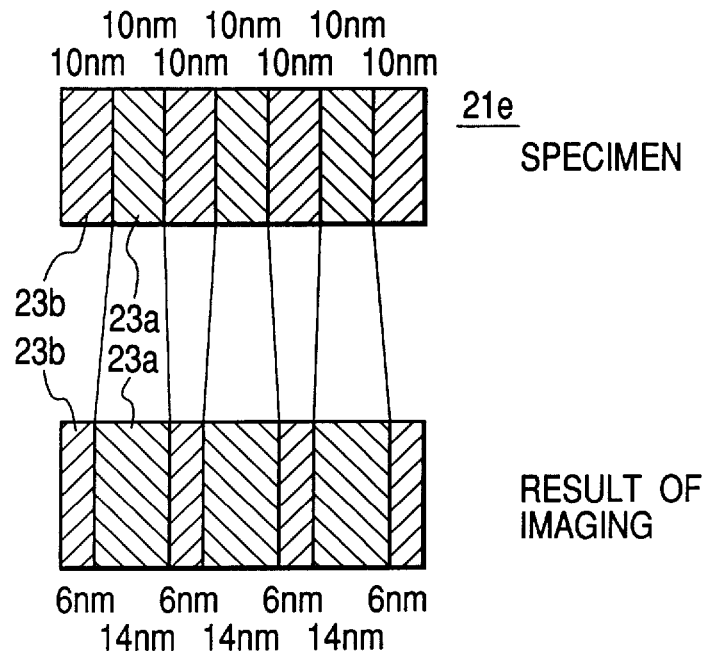
FIG. 10 is a diagrammatic illustration showing a performance evaluation specimen comprising films striped at intervals of 10 nm and a result of imaging thereof.
Figure 11:
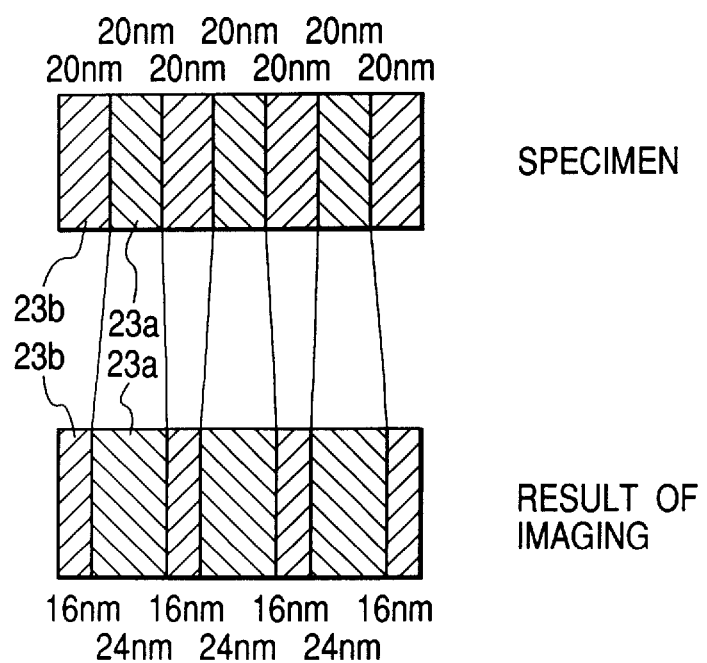
FIG. 11 is a diagrammatic illustration showing a performance evaluation specimen comprising films striped at intervals of 20 nm and a result of imaging thereof.

For the specimen shown in FIG. 8, each white part 23a of the SEM image appears to expand uniformly under an electron optical condition of a constant magnification and a constant accelerating voltage, as shown in FIGS. 10 and 11. For instance, at a constant electron optical magnification and a constant accelerating voltage, if a white part 23a of a SEM image of a specimen having a pattern striped at intervals of 10 nm appears to expand to 14 nm, a white part 23a of a SEM image of a specimen having a pattern striped at intervals of 20 nm appears to expand to 24 nm. Since the degree of expansion is identical, as mentioned above, the resolution can be defined accordingly, i.e., a value of 4 nm can be defined as the resolution in the above example.

Referring to FIG. 13, there is shown an example of a specimen prepared for resolving power/resolution evaluation. On this specimen, stripe patterns shown in FIGS. 2, 4, 6 and 8 are arranged to allow evaluation of the resolving power/resolution in a plurality of methods without the need for specimen replacement.

Figure 14:
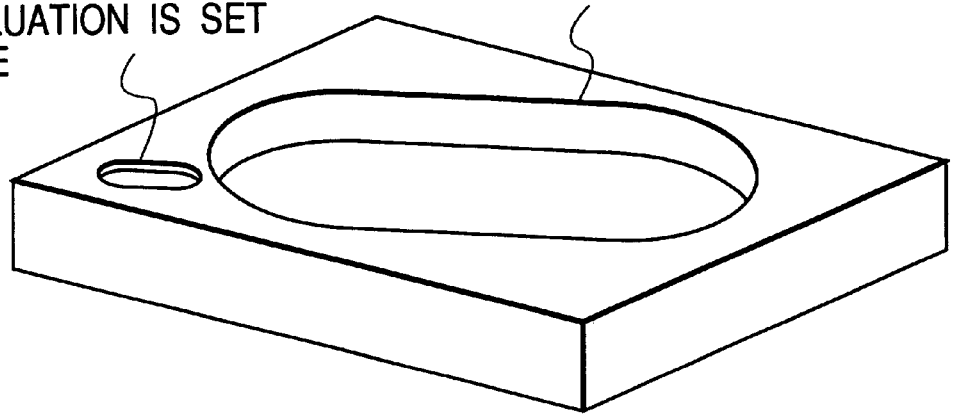
FIG. 14 is a diagram showing in perspective a specimen stage.
Figure 15:
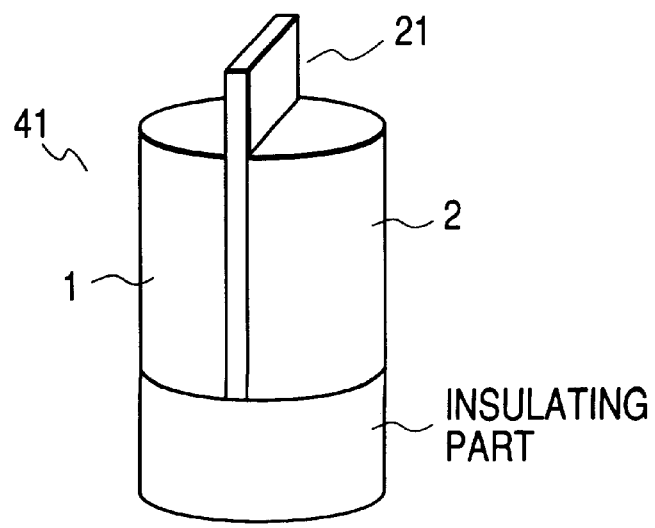
FIG. 15 is a diagram showing in perspective an electrical heating specimen holder.

Referring to FIG. 14, there is shown a preferred embodiment of a specimen stage/holder 24 for mounting the specimen 1 or the resolving power evaluation specimen 21. In semiconductor device inspection, for example, the specimen stage/holder 24 having a square shape on which a circular wafer is mounted provides unoccupied areas at the four corners thereof. At any of these four corner positions, a specimen holder 41 shown in FIG. 15 may be mounted. On the specimen holder 41, the specimen 21 is sandwiched between electrode parts for electrical connection. In use of an ordinary specimen holder, once the specimen 21 is subjected to SEM imaging, it cannot be used again due to charge buildup or surface contamination incurred during observation. However, charge buildup and surface contamination can be removed by electrically heating the specimen 21 to 1000 deg. C. or higher, for example, resulting in reduction in the number of specimen replacements or elimination of specimen replacement.

Figure 16:
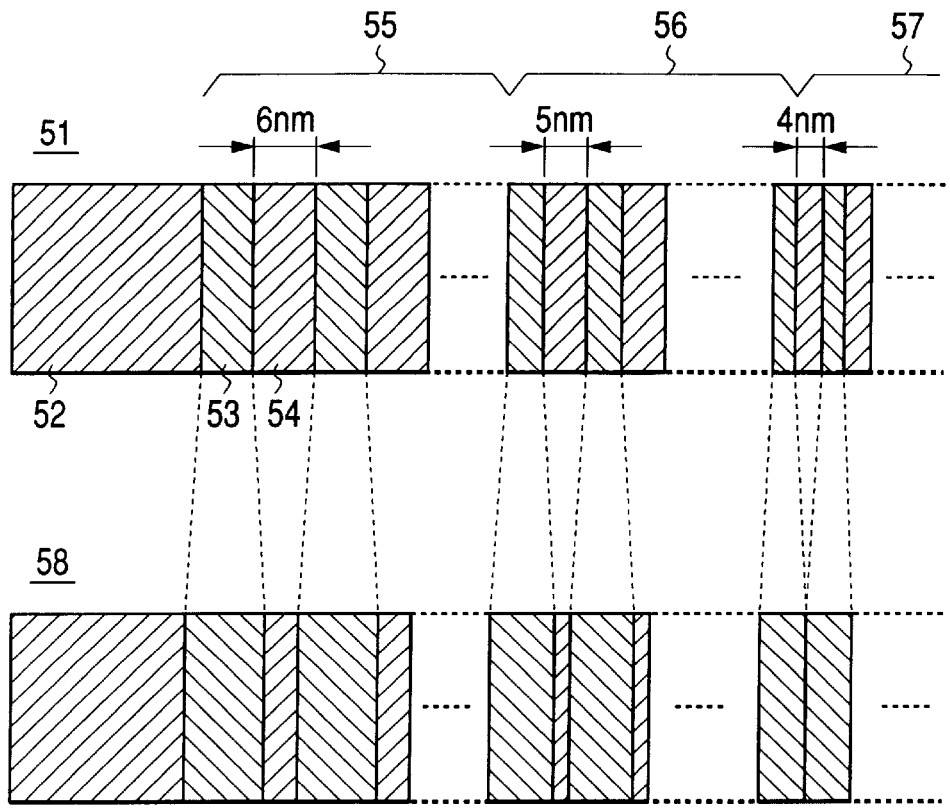
FIG. 16 is a diagram which shows a configuration and SEM image of a specimen in which metallic materials having different emission coefficients of secondary electrons are laminated at different dimensional intervals.

FIG. 16 shows the configuration of a specimen 51 prepared for resolving power evaluation. In preparation of the specimen 51, W films 53 and C films 54 are laminated on a Si wafer 52. More specifically, in a dimensional interval A 55, C films 54 each having a thickness of 6 nm and W films 53 each having a thickness of 3 to 10 nm are laminated repetitively. In a dimensional interval B 56, C films 54 each having a thickness of 5 nm and W films 53 each having a thickness of 3 to 10 nm are laminated repetitively. Then, in a dimensional interval C 57, C films 54 each having a thickness of 4 nm and W films 53 each having a thickness to 3 to 10 nm are laminated repetitively. It is obvious to those skilled in the art that the thickness of each W film 53 is not necessarily 3 to 10 nm. In SEM observation of the specimen 51, its SEM image is displayed on display means 30, i.e., the display means 30 presents a SEM image 58 as shown in FIG. 16. In the dimensional interval 57 on the SEM image 58, although C films 54 each having a thickness of 4 nm are laminated, each white image part of W film 53 appears to expand to disable observation of each dark image part of C film 54. This signifies that the SEM under evaluation is capable of distinguishing a dimension of 5 nm separately, but is not capable of detectably separating a dimension of 4 nm. Thus, by means of specimen observation, the resolving power of the SEM under evaluation is found to be 5 nm.

Figure 17:
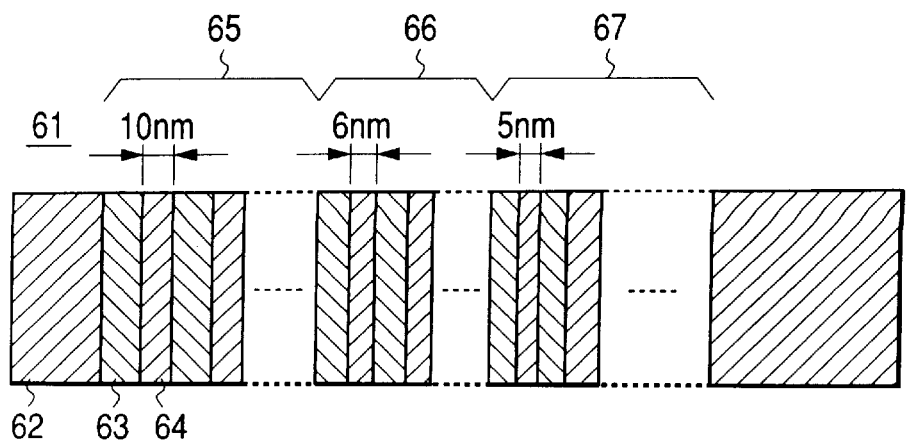
FIG. 17 is a diagram which shows another example of a configuration of a specimen in which metallic materials having different emission coefficients of secondary electrons are laminated at different dimensional intervals.

A method of SEM resolving power measurement using a specimen 61 as shown in FIG. 17 will be described without using the performance evaluation chart shown in FIG. 12.

In preparation of the specimen 61, for example, Ru films 63 and C films 64 are laminated on a Si wafer 62. More specifically, in a dimensional interval A 65, C films 64 each having a thickness of 10 nm and Ru films 63 each having a thickness of 3 to 10 nm are laminated repetitively. In a dimensional interval B 66, C films each having a thickness of 6 nm and Ru films 63 each having a thickness of 3 to 10 nm are laminated repetitively. Then, in a dimensional interval C 67, C films each having a thickness of 5 nm and Ru films 63 each having a thickness of 3 to 10 nm are laminated repetitively. It will be obvious to those skilled in the art that the thickness of each Ru film 63 need not necessarily be 3 to 10 nm.

Figure 18:
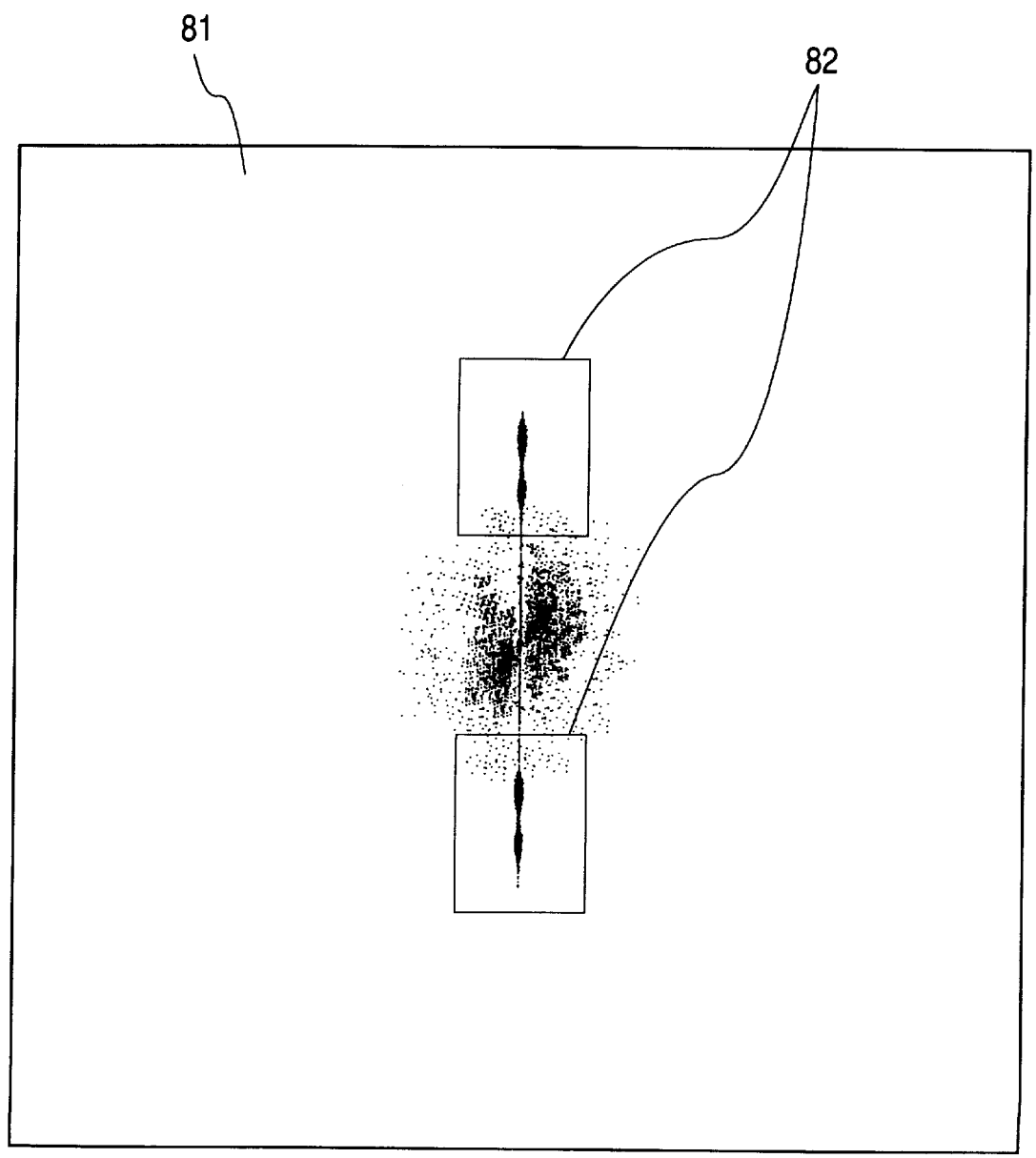
FIG. 18 is a diagram which shows a Fourier-transform image of a resolution evaluation specimen.
Figure 19:
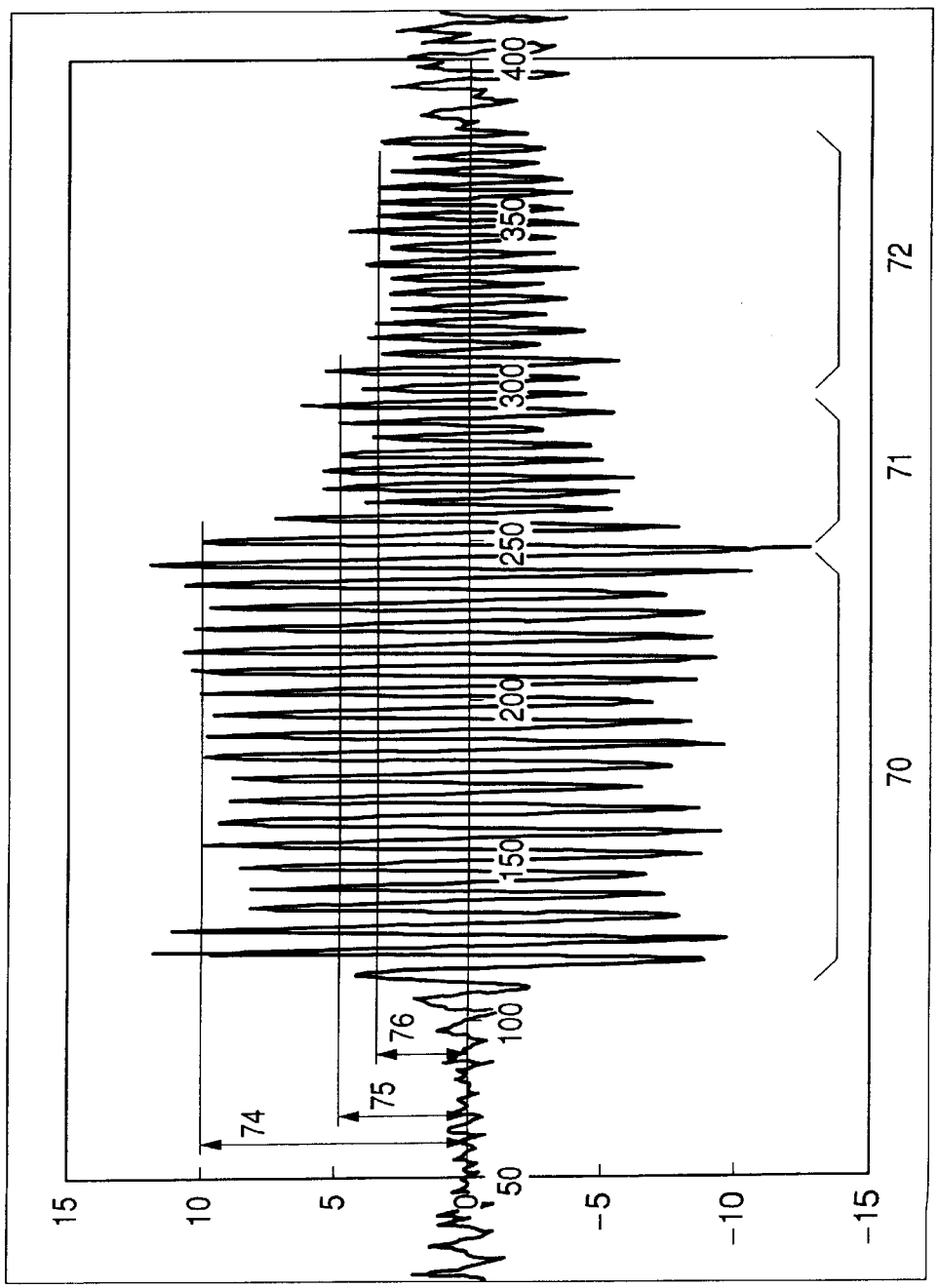
FIG. 19 is a diagram which shows a SEM image profile which is attained through Fourier transformation and then inverse transformation using a bandpass filter.

In a situation where a SEM image of the specimen 61 is provided, a power spectrum similar to that shown in FIG. 9 can be obtained through Fourier transformation. Then, only frequency components in the dimensional intervals D 65, E 66 and F 67 are taken, which correspond to the stripe-pattern frequency signals in FIG. 9. To be more specific, a plurality of spots 82 appearing in a Fourier-transform image 81 shown in FIG. 18 are taken. These spots 82 are subjected to inverse Fourier transformation to reproduce a bandpass-filtered SEM image. FIG. 19 shows a luminance profile of the SEM image.

Figure 20:
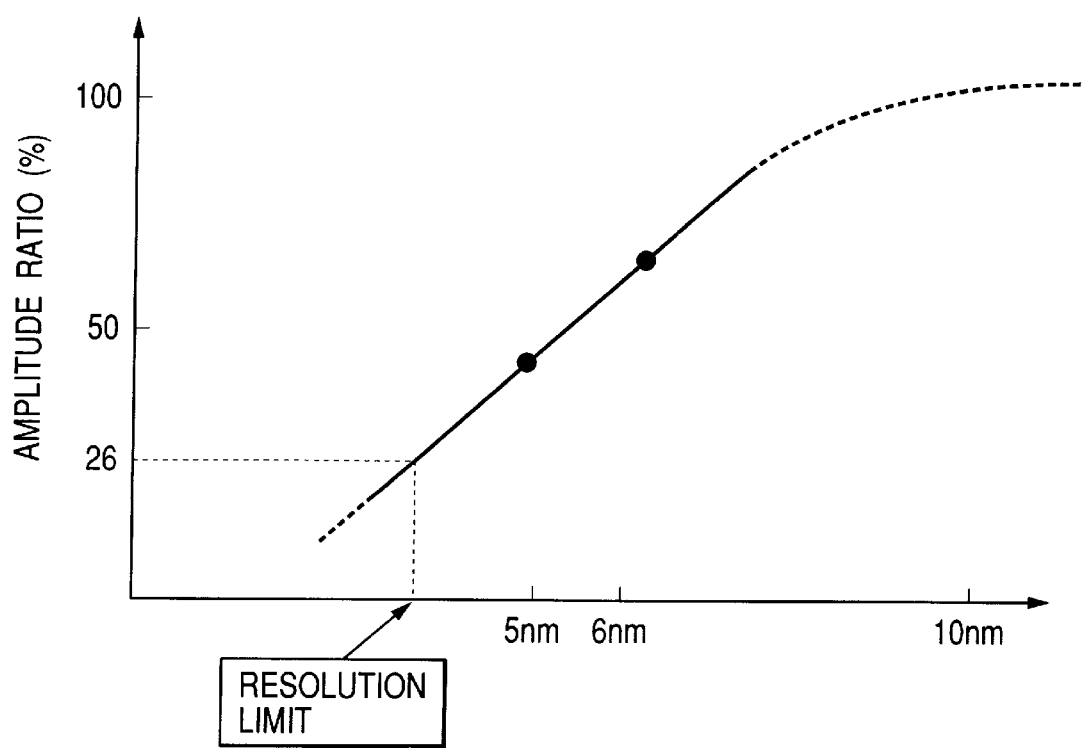
FIG. 20 is a graph showing a SEM resolving power evaluation curve.

In the dimensional intervals D 65, E 66 and F 67, the amplitude of the luminance decreases in the order of amplitude D, amplitude E and amplitude F. As the interval of the stripes is narrowed, the degree of detectable separation in the imaging becomes lower. Under the condition that completely detectable separation in imaging is attainable in the dimensional interval D, a ratio of the amplitudes D, E and F in FIG. 19 can be plotted as a resolution curve or line, as shown in FIG. 20, in which the interval (nm) is indicated on the abscissa and the amplitude ratio (%) is indicated on the ordinate. By applying the Rayleigh limit of optical resolution, a value on the abscissa, corresponding to a point below a level of 26% on the plotted curve or line, can be defined as a limit of the resolution/resolving power. The level of 26% may be changed for each instrument model according to experimental data obtained from correlation examination, etc.

As material films to be laminated, combinations of W film and Si film, Ru film and C film, Mo film and B4C film, Ta film and Si film, etc. may be used in addition to a combination of W film and C film.

While the single-crystal silicon substrate is used as a substrate on which these thin films are formed in the present preferred embodiments, it is to be understood that an applicable substrate material is not limited to single-crystal silicon.

The specimen 51 prepared for SEM resolving power evaluation is not only applicable to performance evaluation in SEM production, but also is applicable to aging evaluation in SEM routine checkup or maintenance.

Further, the numeric processor 19 may be arranged to incorporate image processing technology for performing automatic dimension measurement on a degree of image expansion through use of the above-mentioned phenomena in SEM imaging. This makes it possible to carry out automatic measurement and quantitative evaluation of the resolving power of each SEM. With the specimen 51 being mounted, each SEM can control its own resolving power performance at all times.

Although reference has been made to a one-dimensional direction (X-axis direction) in the present preferred embodiments, it will be obvious to those skilled in the art that the invention is applicable also to two-dimensional directions. It will also be obvious that the resolving power varies with a change in the accelerating voltage.

Furthermore, if the resolving power performance is not satisfactory, the focusing condition can be adjusted by changing the input condition set values for controlling the electron optical system, including the electromagnetic lens 14, through use of input means 31. By changing the input condition set values for regulating a vacuum control system 32 through use of the input means 31, it is also possible to adjust the degree of vacuum. In a situation where the electron gun 13 is not conditioned properly, it is necessary to adjust the electron gun 13.

Moreover, since a storage device connected with the numeric processor 19 retains a record of the resolving power performance, it is possible to let each user access a particular record of the resolving power performance through the display means at any time.

As set forth hereinabove, the present invention makes it possible to carry out quantitative evaluation of SEM resolving power/resolution using a multi-thin-film-layered specimen having known dimensions by means of frequency analysis of result data of SEM imaging, etc., thereby enabling acquisition of accurate data concerning the SEM performance and deterioration with age. Particularly in semiconductor device inspection or semiconductor device fabrication, where a plurality of SEM instruments are used, the present invention can contribute to reduction in instrumental error among SEM instruments to improve the accuracy of measurement.

Still more, unlike the conventional method of SEM performance evaluation using a gold-particle-evaporated carbon specimen, in which results of evaluation are affected by variations in the size and shape of the gold particles, the present invention enables consistent quantitative evaluation of SEM performance at any time using a specimen prepared as mentioned above. Besides, through measurement on a degree of SEM image expansion, it is possible to implement automatic measurement of the resolving power.

The invention may be embodied in other specific forms without departing from the spirit or essential characteristics thereof. The present embodiments are therefore to be considered in all respects as illustrative and not restrictive, the scope of the invention being indicated by the appended claims rather by the foregoing description and all changes which come within the meaning and range of equivalency of the claims are therefore intended to be embraced therein.

What is claimed is:

1. An electron microscope resolving power evaluation method, comprising the steps of:

preparing a specimen by overlaying materials having different emission coefficients of secondary charged particles;

irradiating a cross-section including an overlaid material part of said specimen with an electron beam to obtain a secondary charged particle image of the cross-section of said specimen by detecting secondary charged particles emitted therefrom; and performing quantitative evaluation of electron microscope resolving power using said secondary charged particle image.

2. An electron microscope resolving power evaluation method, comprising the steps of:

preparing a specimen by laminating thin films of materials having different emission coefficients of secondary charged particles on a substrate;

irradiating a cross-section including a laminated part of said specimen with an electron beam to attain a secondary charged particle image of the cross-section of said specimen by detecting secondary charged particles emitted therefrom; and performing quantitative evaluation of electron microscope resolving power using said secondary charged particle image.

3. An electron microscope resolving power evaluation method as claimed in claim 2, wherein each thin film laminated on said substrate has a known thickness.

4. An electron microscope resolving power evaluation method, comprising the steps of:

preparing a specimen comprising a cross-section including layers of two or more materials having different emission coefficients of secondary electrons, backscattered electrons or transmitted electrons;

obtaining an image of boundaries of said layers on the cross-section of said specimen using the electron microscope; and performing quantitative evaluation of electron microscope resolving power through numeric processing of data of said image.

5. An electron microscope resolving power evaluation method, comprising the steps of:

preparing a specimen including layers of two or more materials having different emission coefficients of secondary electrons, backscattered electrons or transmitted electrons;

obtaining an image of boundaries of said layers on a cross-section of said specimen using the electron microscope; and performing quantitative evaluation of electron microscope resolving power using said image.

6. An electron microscope resolving power evaluation method, comprising the steps of:

preparing a specimen having a cross-section including multiple thin-film layers of two or more materials having different emission coefficients of secondary electrons, backscattered electrons or transmitted electrons;

obtaining an image of the cross-section including said multiple thin-film layers using the electron microscope; and performing quantitative evaluation of electron microscope resolving power through numeric processing of data of said image.

7. An electron microscope resolving power evaluation method, comprising the steps of:

preparing a specimen having a cross-section including multiple thin-film layers of two or more materials having different emission coefficients of secondary electrons, backscattered electrons or transmitted electrons;

obtaining an image of the cross-section including said multiple thin-film layers using the electron microscope; and performing quantitative evaluation of electron microscope resolving power using said image thus attained.

8. An electron microscope adjustment method, comprising the steps of:

preparing a specimen by laminating thin films of materials having different emission coefficients of secondary charged particles;

irradiating a cross-section including a laminated part of said specimen with an electron beam in an electron microscope to attain a secondary charged particle image of the cross-section of said specimen by detecting secondary charged particles emitted therefrom;

performing quantitative evaluation of the resolving power of said electron microscope using said secondary charged particle image; and adjusting at least one of an electron optical system, a vacuum system and an electron gun of said electron microscope according to a result of evaluation of the resolving power thereof.

9. An electron microscope, comprising:

means for attaining an image of a cross-section of a specimen including multiple thin-film layers of two or more materials having different emission coefficients of secondary electrons, backscattered electrons or transmitted electrons, by electron beam scanning the specimen, said multiple thin-film layers being formed to have known dimensions; and means for carrying out quantitative evaluation of the resolving power of said electron microscope by measuring an electron beam shape through numeric processing of data of said image.

* * * * *